US008975505B2

(12) United States Patent
Ladner

(10) Patent No.: US 8,975,505 B2
(45) Date of Patent: Mar. 10, 2015

(54) CONCENTRATED SOLAR THERMOELECTRIC POWER SYSTEM AND NUMERICAL DESIGN MODEL

(76) Inventor: Daniel Ray Ladner, Boulder, CO (US)

( * ) Notice: Subject to any disclaimer, the term of this patent is extended or adjusted under 35 U.S.C. 154(b) by 298 days.

(21) Appl. No.: 12/924,484

(22) Filed: Sep. 28, 2010

(65) Prior Publication Data

US 2011/0073149 A1  Mar. 31, 2011

Related U.S. Application Data

(60) Provisional application No. 61/277,662, filed on Sep. 28, 2009.

(51) Int. Cl.
| | | |
|---|---|---|
| *H01L 35/00* | (2006.01) | |
| *H01L 35/30* | (2006.01) | |
| *F24J 2/13* | (2006.01) | |
| *F24J 2/14* | (2006.01) | |
| *F24J 2/18* | (2006.01) | |
| *F24J 2/46* | (2006.01) | |
| *F24J 2/50* | (2006.01) | |

(52) U.S. Cl.
CPC . *H01L 35/30* (2013.01); *F24J 2/13* (2013.01); *F24J 2/14* (2013.01); *F24J 2/18* (2013.01); *F24J 2/4621* (2013.01); *F24J 2/4625* (2013.01); *F24J 2/50* (2013.01); *F24J 2200/04* (2013.01); *Y02E 10/45* (2013.01)
USPC .......................................... 136/214; 136/206

(58) Field of Classification Search
CPC ........ H01L 35/28; H01L 35/325; H01L 35/00
USPC ................................................. 136/214, 206
See application file for complete search history.

(56) References Cited

U.S. PATENT DOCUMENTS

| | | | | | |
|---|---|---|---|---|---|
| 4,002,499 | A | * | 1/1977 | Winston ........................ | 136/206 |
| 4,131,485 | A | * | 12/1978 | Meinel et al. ................. | 136/259 |
| 4,284,867 | A | * | 8/1981 | Hill et al. ...................... | 219/634 |
| 4,518,232 | A | * | 5/1985 | Dagenais ...................... | 359/853 |
| 4,883,522 | A | * | 11/1989 | Hagerty et al. ................ | 65/17.6 |
| 5,154,777 | A | * | 10/1992 | Blackmon et al. ............ | 136/245 |
| 5,274,497 | A | * | 12/1993 | Casey ............................ | 359/364 |

(Continued)

OTHER PUBLICATIONS

Definition of "soliid" obtained from dictionary.com. 2013.*

*Primary Examiner* — Jeffrey T Barton
*Assistant Examiner* — Uyen Tran

(57) ABSTRACT

The invention, the Concentrated Solar Thermoelectric Power System, herein abbreviated as C-STEPS, is a thermo-optical system configuration for the purpose of achieving a high solar energy-to-electricity conversion efficiency based on thermoelectric (TE) devices that use the Seebeck effect. It does so by implementing a system for concentrated solar energy using a design that combines a dual-function reflector/radiator component with an active or passive heat convection mechanism to ensure that TE module operation is maintained in a safe elevated temperature range with respect to the ambient temperature. Unsafe module temperatures are avoided by automatically adjusting the TE module hot side temperature directly or indirectly by regulating the TE cold side temperature using a variety of passive or active mechanisms, including the reflector/radiator component, phase change material, or convection/conduction mechanisms. A Numerical Design Model is used to optimize the configuration geometry and performance in various terrestrial and space applications and it is a central feature of the invention.

20 Claims, 6 Drawing Sheets

(56) References Cited

U.S. PATENT DOCUMENTS

| | | | |
|---|---|---|---|
| 5,936,193 A * | 8/1999 | Parise | 136/205 |
| 6,067,802 A * | 5/2000 | Alonso | 62/3.7 |
| 6,200,665 B1 * | 3/2001 | Seto | 428/192 |
| 2004/0031517 A1 * | 2/2004 | Bareis | 136/246 |
| 2009/0235975 A1 * | 9/2009 | Shingleton | 136/246 |
| 2009/0260667 A1 * | 10/2009 | Chen et al. | 136/201 |
| 2010/0154888 A1 * | 6/2010 | Kadi | 136/259 |
| 2010/0186794 A1 | 7/2010 | Chen | |

* cited by examiner

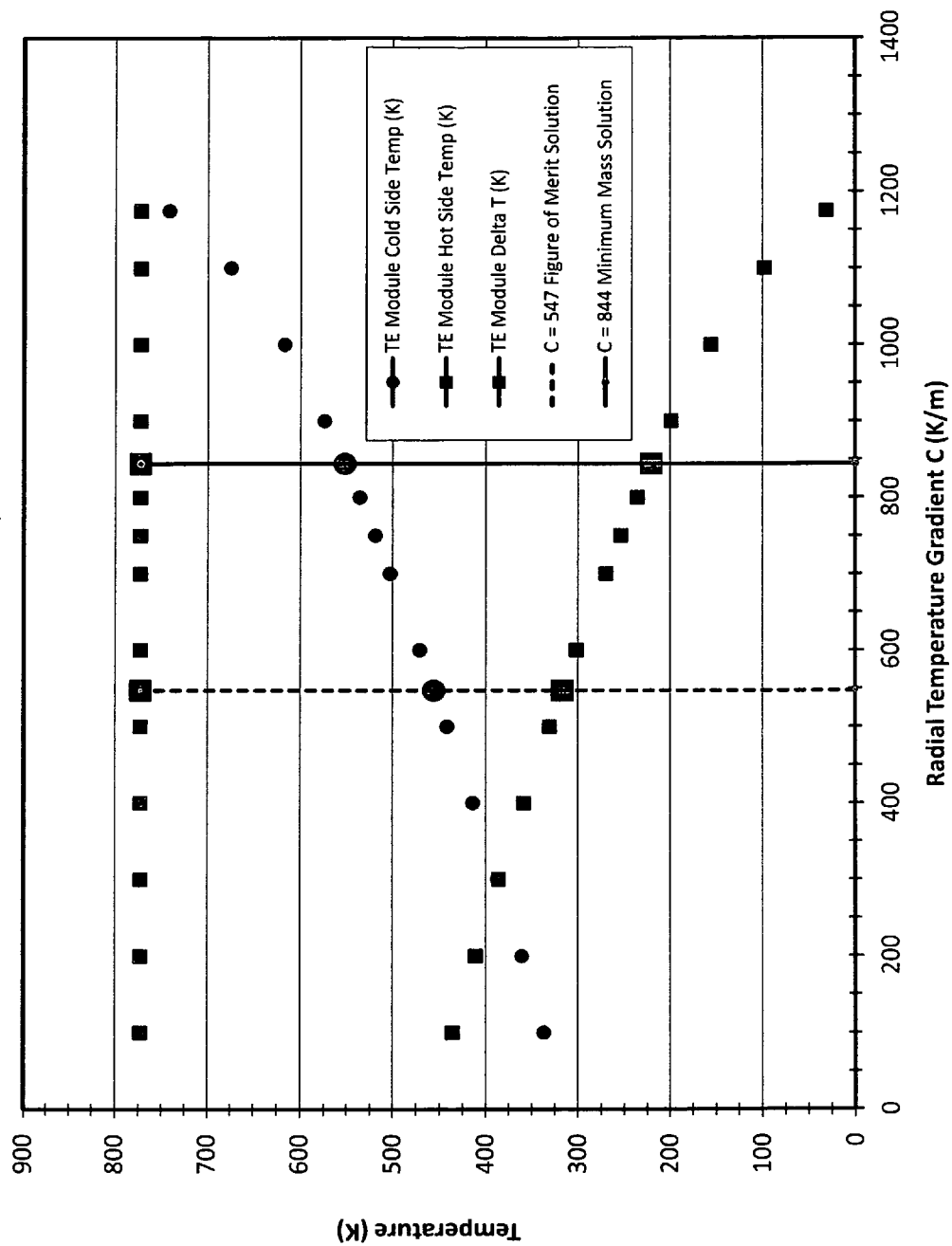

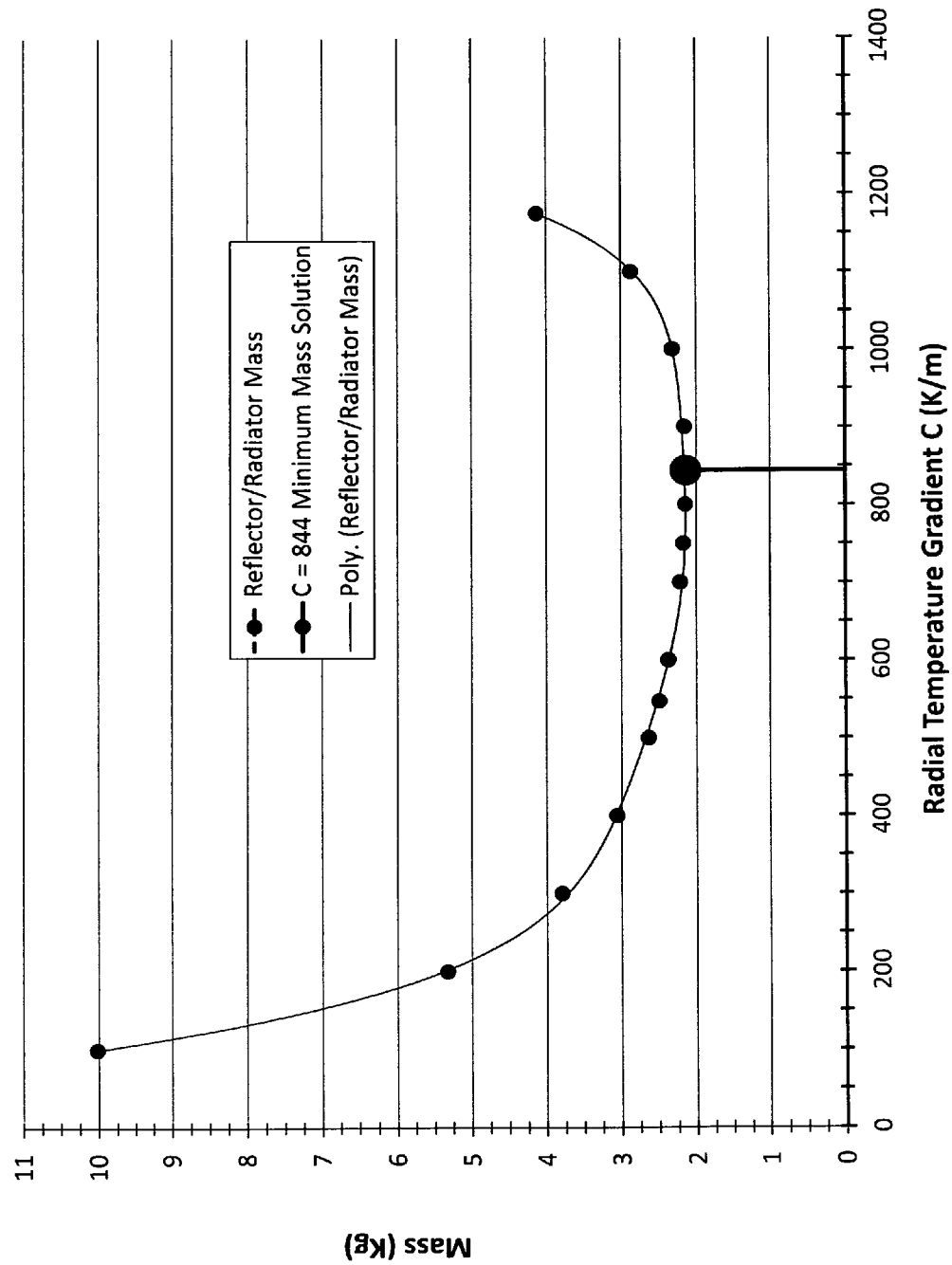

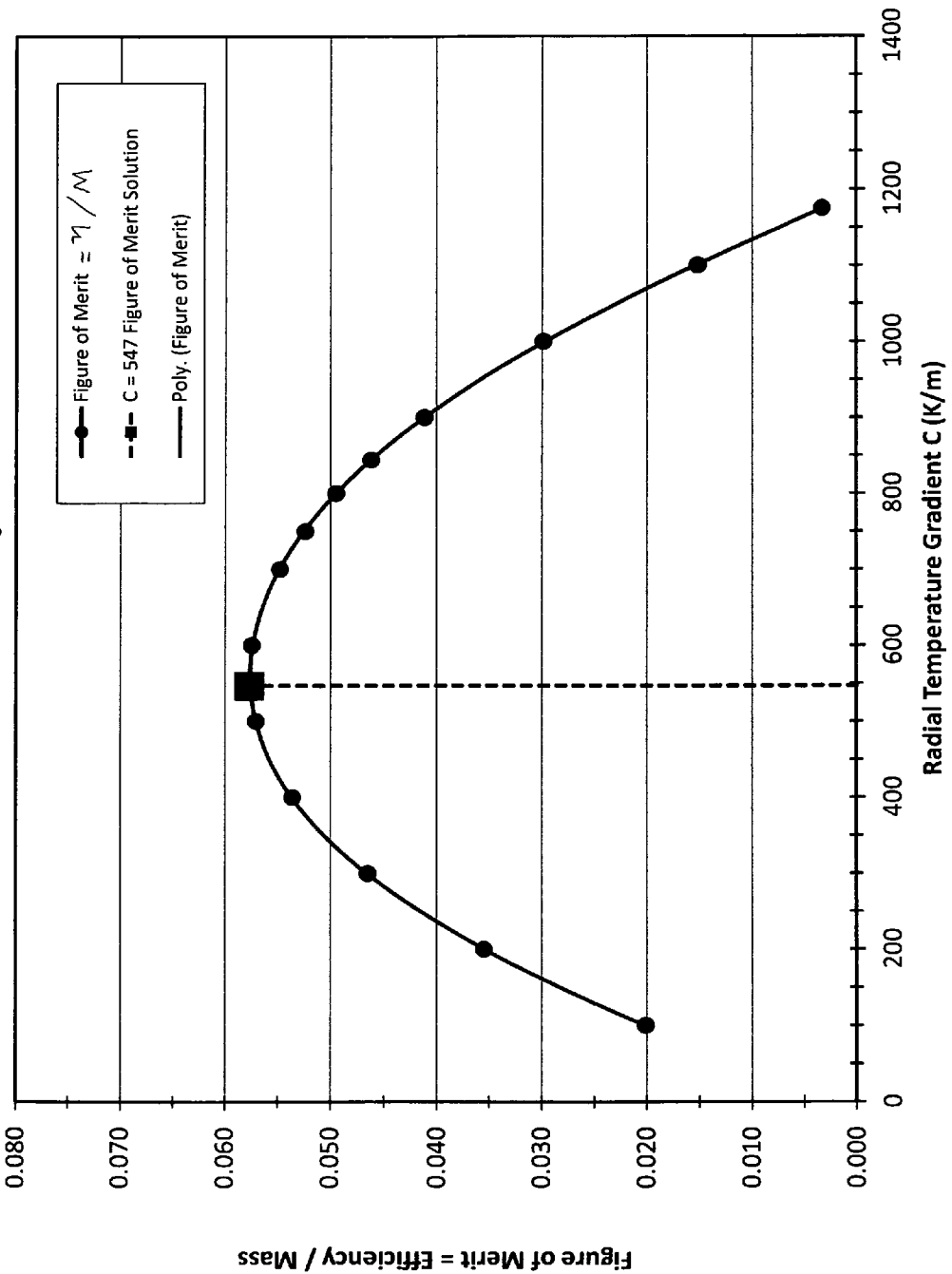

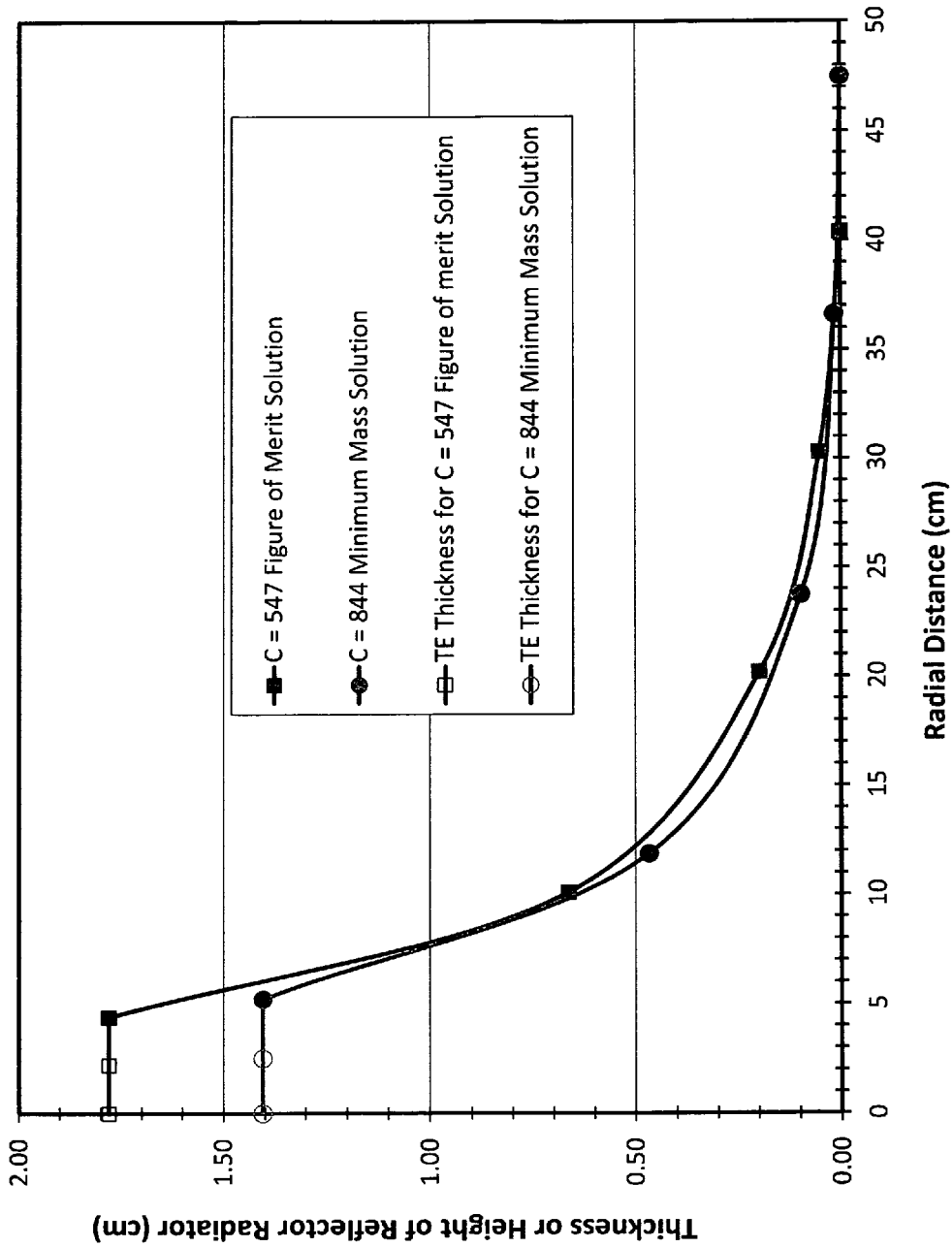
Figure 4. RR Thickness vs. Radial Distance (Thickness Profile) for 2 Design Solutions

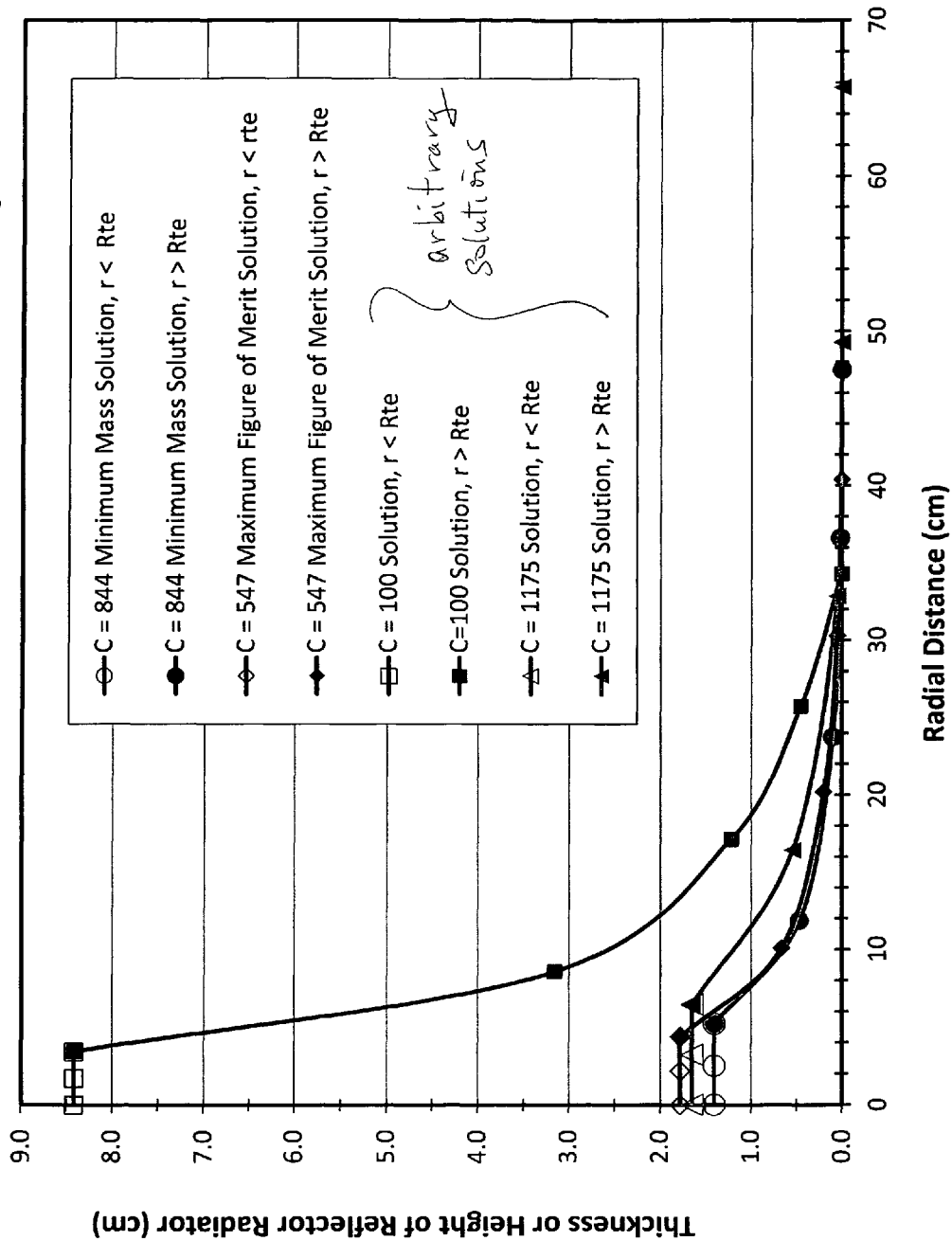
Figure 5. Comparison of Thickness Profiles of Solutions vs. Arbitrary C values

CONCENTRATED SOLAR THERMOELECTRIC POWER SYSTEM AND NUMERICAL DESIGN MODEL

CROSS-REFERENCE TO RELATED PATENT APPLICATION

The present application claims the benefit of a U.S. Provisional Patent Application Ser. No. U.S. 61/277,662, filed Sep. 28, 2009. The entire contents of this provisional patent application are hereby incorporated by reference herein.

FIELD OF THE INVENTION

The present invention relates to the conversion of concentrated solar energy into electricity and the utilization of unconverted excess thermal energy for terrestrial water/air heating applications by convection or conduction, as a renewable energy method, and the conversion of concentrated solar energy into electricity and the removal of unconverted excess thermal energy by IR radiation from the primary reflector itself in a space or terrestrial application.

BACKGROUND OF THE INVENTION

The basic physical principle of the heat-to-electricity conversion employed by the invention is the Seebeck effect, whereby a temperature difference produces a voltage across a p-n junction. This is essentially the inverse of the Peltier effect whereby an applied voltage can be used to generate either cooling or heating, depending on the polarity of the voltage. This process involves the diffusion transport of electrons and holes. Highly efficient doped bulk alloy semi-conductors, that are operated at elevated temperatures and can be machined or fabricated to meet practical design requirements without complicated manufacturing processes, make this type of TE device appealing for direct electricity generation in both terrestrial and space applications. The underlying physics is thought to be an enhancement of electrical conductivity via the doping agent by increasing the density of electron states, which increases the Seebeck coefficient, without increasing the thermal conductivity of the semi-conductor. The invention provides a method to take advantage of doped bulk alloy materials that have high figures-of-merit and therefore high electrical conversion efficiencies at elevated temperatures. Other types of TE devices, such as nano-structured semiconductors, can also be used in the invention.

The theoretical efficiency $\eta te$ of a TE device based on the Seebeck effect can be expressed as the product of two factors, $\eta te = \eta car * (\eta te/\eta car)$. A high device efficiency $\eta te$ requires a high Carnot efficiency, $\eta car = \Delta T/T hot$, which implies that a large temperature difference, $\Delta T = T hot - T cold$, where T hot is the TE hot side temperature and T cold is the cold side TE temperature, is desirable across the device for a given value of T hot. The second factor $\eta te/\eta car$ in the expression for $\eta te$ is the fraction of Carnot for TE devices and it is a nonlinearly increasing function of ZT, the dimensionless figure-of-merit for the TE device, where Z itself may be a function of temperature. The figure-of-merit Z is defined as $Z = \alpha^2 \sigma/k$, where $\alpha$ is the Seebeck coefficient, $\sigma$ is the electrical conductivity, and k is the thermal conductivity of the device material. The factor $\eta te/\eta car$ is commonly presented as $\eta te/\eta car = [(M-1)/(M+1-\eta car)]$, where $M = (<ZT>+1)^0.5$. In determining the maximum TE device efficiency $\eta te$, as the device figure-of-merit varies over the module temperature range Tcold<T<Thot, the integrated average value of ZT for both the n-doped and p-doped components, $<ZT>$, is the appropriate figure-of-merit for estimating the device efficiency. For a given value of war, an increase in $<Z>$ by a factor of two (for example, $Z=0.002/K \rightarrow Z=0.004/K$) can result in a 50% increase in $\eta te$.

The ratio $\eta te/\eta car$ can be expressed explicitly in terms of $<ZT>$ and $\eta car$, and it turns out to be a relatively weaker function of $\Delta T$ than does $\eta car$, which is directly proportional to $\Delta T$. Because the figure-of-merit Z is highest at the highest temperatures, a small $\Delta T$ in the upper temperature range maximizes $<ZT>$, but since $\eta car$ is the more dominant factor in the product $\eta car * (\eta te/\eta car)$, the optimum $\Delta T$ to maximize the efficiency $\eta te$ turns out to be its largest practical value for any given value of Tcold. If contact thermal resistance is minimized, the value of $\Delta T$ depends on the product of the TE device total (intrinsic and contact) thermal resistance Rte and the conducted heat flow Qcond, which depends on the magnitude of the solar flux and $\eta te$, so that Thot=Tcold+Rt*Qcond. Therefore, it follows that the optimum value of Tcold should be its lowest practical value to maximize $\eta car$ and $\eta te$. An additional operational constraint is that Thot must not exceed a maximum temperature Tcrit that could damage the TE device. The invention provides an arrangement of passive and active mechanisms to achieve the lowest practical value of Tcold, consistent with a terrestrial or space environment, and the largest value of $\Delta T$, such that Thot<Tcrit. Given the potential variation of the heat input source, i.e., the solar flux, $\Delta T$ may be limited by the maximum available heat flow Qcond. In this case the invention Numerical Design Model provides the optimum design and operating mode to maximize $\eta te$. Alternatively, the invention Numerical Design Model can be programmed to optimize other desirable results, such as minimum C-STEPS mass, as in a space application, while retaining acceptable values of $\eta car$ and $\eta te$.

Previous work on the invention concept was conducted by the inventor beginning in December 2006 under contract to Broad Reach Engineering, Golden Colo. Several Small Business Innovative Research (SBIR) proposals for funding the development of the invention have been submitted by the inventor to NASA and other U.S. Government agencies since December 2006, although no development funding has been obtained as of the date of this application.

Direct solar heating of TE devices, with and without solar concentration, is discussed by H. J. Goldsmid in *Applications of Thermoelectricity*, John Wiley and Sons, New York, 1960, pages 112-114. The concept of a reflector/radiator component is not shown or discussed as a method to direct solar flux onto the TE module hot side nor to remove the unconverted conducted heat from the TE module cold side.

Only one U.S. patent could be identified that describes methods for the production of both electrical and thermal energy using a solar energy source in combination with TE devices:

US 2010/0186794A1 Chen et al Jul. 29, 2010

Form 8A, Information Disclosure Statement by Applicant, is attached herein to request inclusion of said patent in the examination process. The following comparisons, design differences, and innovations in regard to the invention described herein are noted:

A dual reflector system is shown in FIG. 10C of patent US 2010/0186794A1 for the purpose of heating the hot side of a TE module located in the vicinity of the central axis of the primary concave reflector. Such a dual reflector system is not a new concept, as it is used in a variety of optical instruments, including Baker-Schmidt cameras, Kellner-Schmidt auto-collimators, and Schmidt-Cassegrain telescopes.

In contrast to the design in FIG. 10C, and its description on page 12 of patent US 2010/0186794A1, and in contrast to the functions of the optical instruments cited in the preceding paragraph, the C-STEPS design for redirecting the solar energy back toward the center of the primary concave reflector/radiator is to permit said reflector/radiator to function as an IR radiator for rejecting some fraction of the conducted heat flowing into the cold side of the TE module, which is mechanically and thermally integrated with the reflector/radiator in the preferred embodiment of the invention. This dual function allows the C-STEPS invention to operate efficiently, especially in a space environment, e.g., on a spacecraft or satellite, in which convection or conduction mechanisms are typically undesirable or impractical for reducing the cold side TE temperature. The dual function of the reflector/radiator as both a solar collector for the TE module hot side heat input, and an IR radiation energy rejection mechanism for the TE cold side excess heat, is a primary differentiating feature of this invention.

Secondly, the extraction of heat from the cold side of the TE module, whether redirected for passive thermal heating or for heat engine electricity production, or neither, is not an innovative or original concept; it is a necessity for basic operation of any TE module by establishing a temperature difference across the TE module. Without such heat removal, whether by design or not, the TE module temperature would increase without limit due to its finite heat capacity, resulting in the destruction of the module.

Additionally, several other features of the C-STEPS invention described herein are innovations not identified or claimed in patent US 2010/0186794A1. These include but are not limited to:

An optically and IR transparent. GRIN or Gradium© glass aperture cover, or shaped variable thickness glass cover, used to correct for spherical aberration, in the case of a spherical primary reflector, and to advantageously redirect a large fraction of incident non-paraxial solar flux onto the secondary reflector, and thereby onto the TE module, if solar tracking is not provided;

An increasing thickness from the effective edge of the radiator/reflector toward its center to provide adequate heat transfer by conduction and thereby effect a sufficiently small radial temperature drop to ensure maximum IR radiation output; the radial distance of the effective edge of the radiator component may be may be less than the distance of the physical edge of the reflector component as determined by the optimization result of the numerical design model described herein.

Use of both sides of the reflector/radiator for maximum surface area for IR radiation to space or sky in some embodiments of the invention;

Use of an optically transparent borosilicate glass window on the hot side of the TE module to minimize IR radiation loss, beyond any such effect obtainable with the optical properties of the absorbing surface of the TE module to maximize solar absorptivity and minimize emissivity, thereby maximizing heat input to the TE module hot side to provide maximum Carnot efficiency and electricity production;

Identification of the optimum reflector system as shown in FIG. 6 for the dual reflector system, viz., two parabolic reflectors (concave primary and convex secondary) such that their foci are coincident, thereby allowing all solar flux incident onto the concave reflector and redirected to the convex reflector to be completely collimated in a symmetrical distribution onto the TE module hot side surface;

Inclusion of a variety of safeguard mechanisms in the invention design to prevent an unsafe high temperature at the TE module hot side or within the TE module proper.

Use of the invention to augment the power output of a solar panel, especially in a space application, in some embodiments of the invention.

A numerical design model to optimize the C-STEPS design geometry as a function of the constraints and input parameter requirements, and to provide the optimum optical path of incident solar radiation as a function of that design, said model examples provided in Addenda 1 and 2.

SUMMARY OF THE INVENTION

The invention described herein, the Concentrated Solar Thermoelectric Power System (herein abbreviated as C-STEPS), is a thermo-optical configuration for the purpose of achieving a high solar energy-to-electricity conversion efficiency based on the Seebeck effect. It does so by implementing concentrated solar energy in a design that combines a single compact dual-function reflector/radiator component with the requirement to operate the thermoelectric (TE) conversion module in an elevated temperature range. By establishing the highest practical TE module hot side (upper) surface temperature Thot by means of solar flux concentration, and the lowest practical TE module cold side (lower) surface temperature Tcold by IR radiation and/or convection or conduction heat removal, the invention generates a large temperature difference $\Delta T$ (=Thot−Tcold) across the TE module as a result of the conducted heat flow Qcond. This passive configuration increases the maximum heat-to-electricity conversion efficiency of the TE n- and p-doped device couples that comprise the TE module.

Values of Thot that exceed a maximum or critical operational value Tcrit, that could cause softening or failure of the TE module components, are avoided by automatically adjusting the TE module cold side surface temperature using a variety of passive or active design mechanisms. These mechanisms in turn regulate Thot to achieve thermal control and maximum efficiency if the solar flux intensity varies. These mechanisms may include but are not limited to the amount of IR radiation emitted from the reflector/radiator surface(s), a heat flow circuit and/or a heat exchanger mechanism to deliver the rejected heat where needed for passive solar heating, a secondary backup convection mechanism, such as a thermostatically driven fan, and a phase change material embedded in or thermally integrated with the reflector/radiator. The reflector/radiator surface(s) may have temperature-dependent IR emissivity properties and the reflector/radiator effective radiator surface area-to-cross-sectional area ratio may vary by baffling the aperture. While the invention provides a method to take advantage of doped bulk alloy semiconductors, such as doped PbTe, that have very high figures-of-merit and high efficiencies at elevated temperatures, its principle of operation and potential application is not restricted to any particular type of TE device. A Numerical Design Model is used to optimize the C-STEPS geometry and performance and it is a central feature of the invention.

Figure 3:
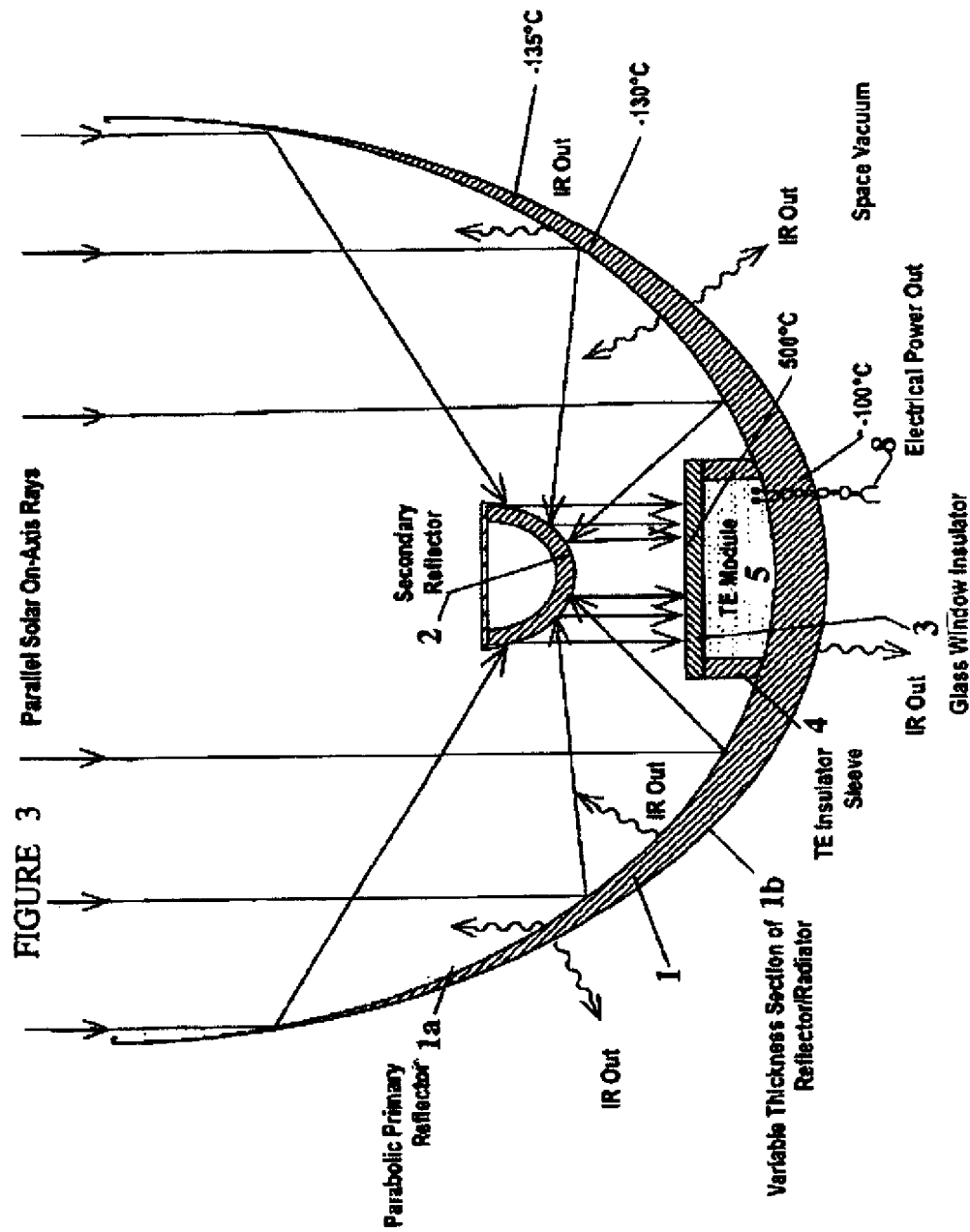

FIG. 3 is a schematic representation of a third embodiment of the invention in which the reflector/radiator has a parabolic front surface reflector and for which no significant thermal insulation requirement exists between the reflector/radiator and the surrounding environment, such that the backside of the reflector/radiator is available for the IR radiation function, as in a space vacuum environment.

Figure 4:
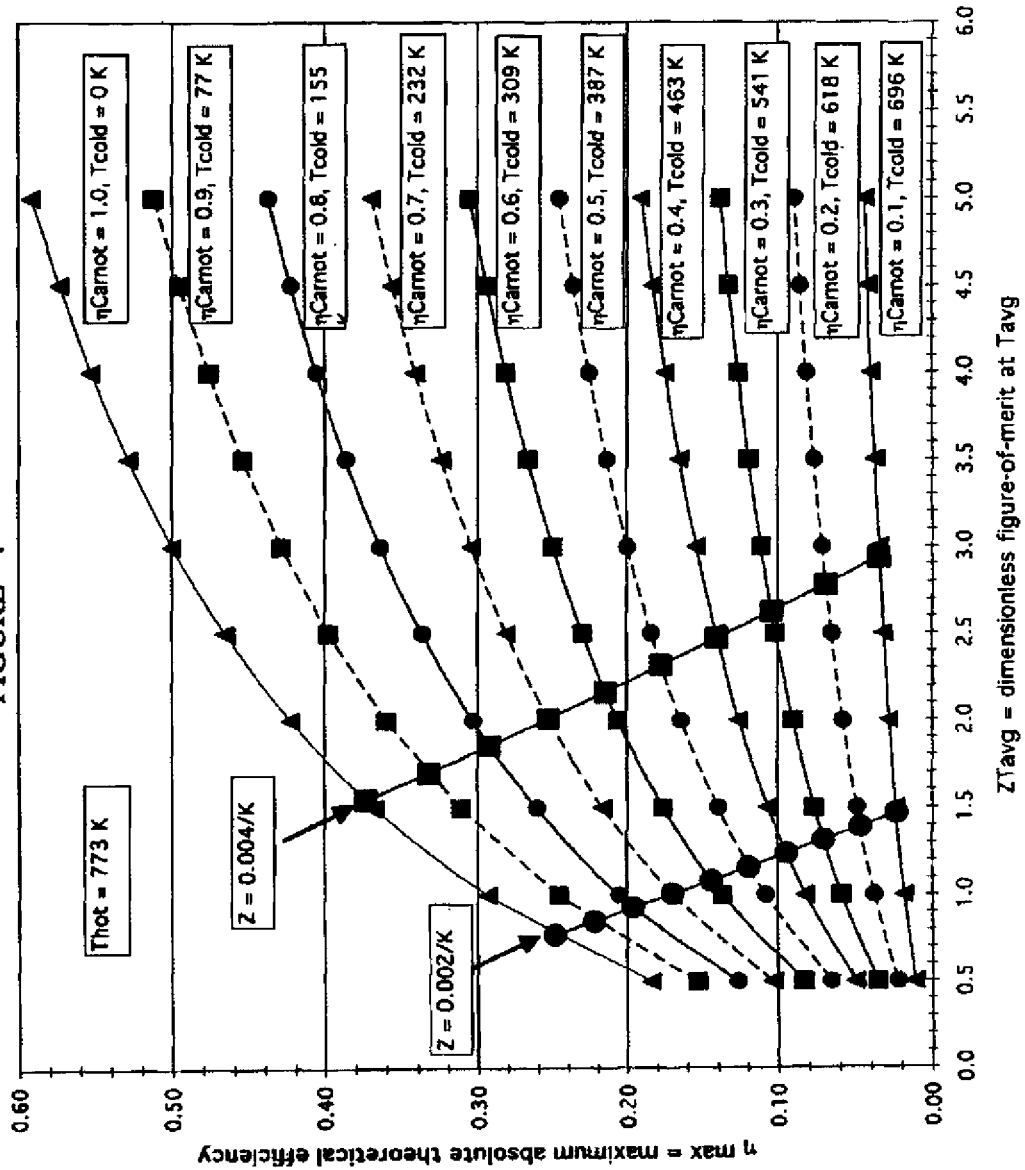

FIG. 4 is a plot showing the absolute maximum electrical conversion efficiency of a TE device as a function of the average non-dimensional figure-of-merit <ZT> and the Carnot fraction over the range of temperatures for which the TE hot side temperature is fixed at 773 K and for which the parameter Z varies approximately linearly with temperature, as in the case of the p-type bulk alloy 2% Tl—PbTe.

Figure 5:
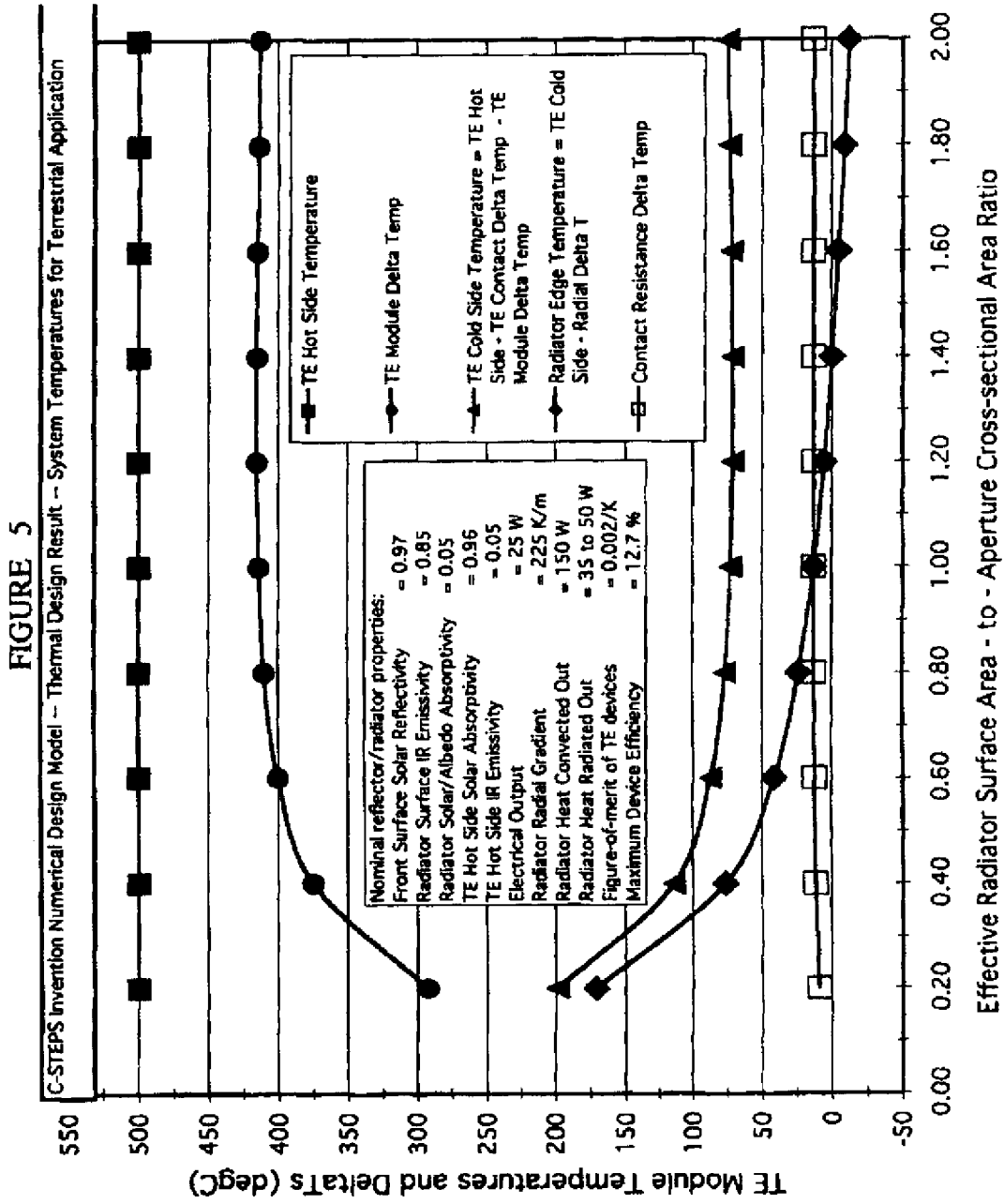

FIG. 5 represents in graphical representation of one subset of the results determined by the Thermal Design Feature of the Numerical Design Model, whereby certain output parameters are plotted as a function of the reflector/radiator effective radiator surface area-to-aperture cross-sectional area ratio for a given set of input parameters and constraints.

Figure 6:
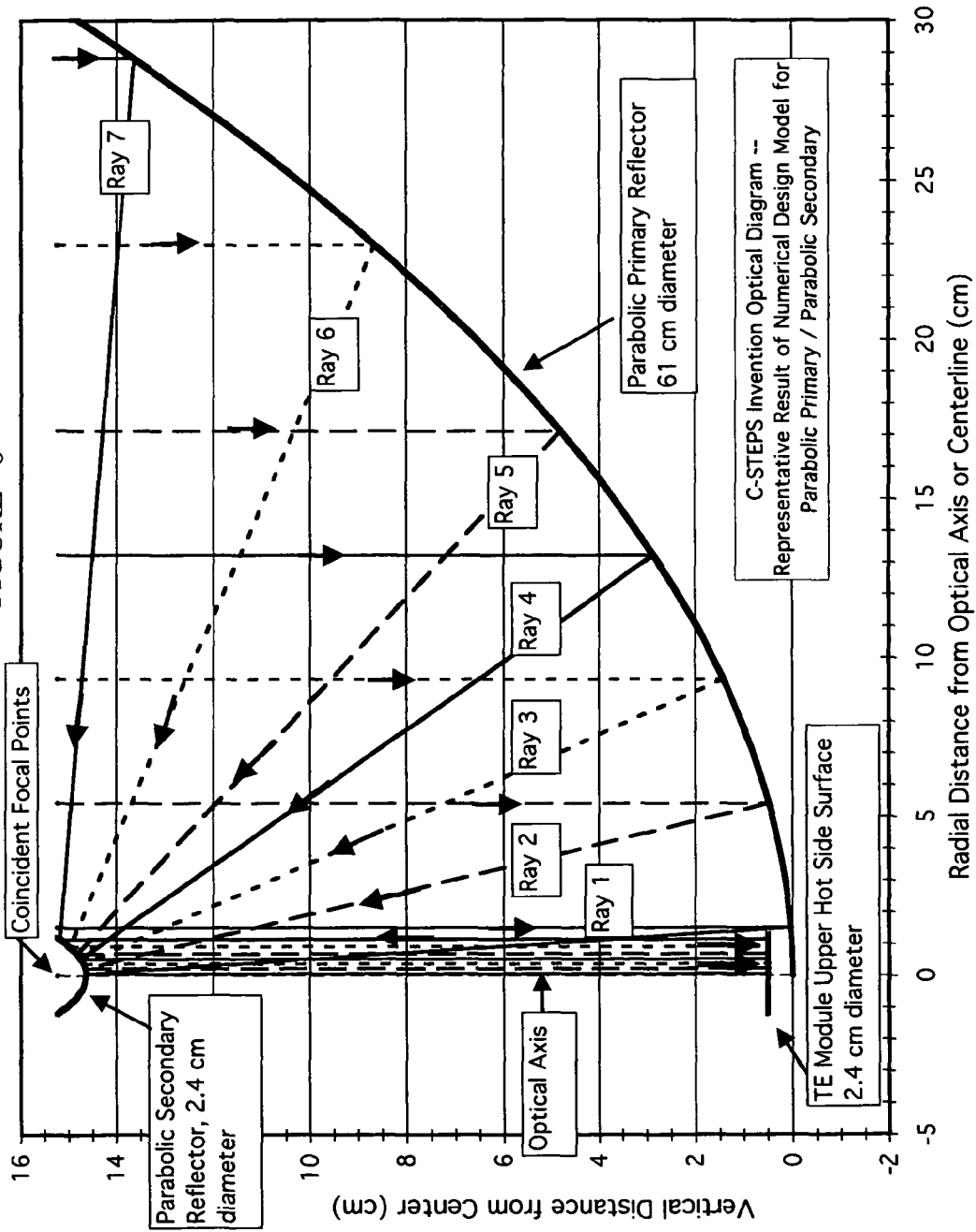

FIG. 6 shows the ideal optical paths as determined by the Optical Design Feature of the Numerical Design Model for paraxial solar radiation, resulting in a collimated cylindrically symmetric concentrated flux distribution at the TE module hot side when using a concave primary parabolic reflector and a convex secondary parabolic reflector having coincident real and virtual foci, respectively, as the preferred optical arrangement with solar tracking and without an aperture cover/corrector glass window-insulator,

DETAILED DESCRIPTION OF THE INVENTION

Thermo-optical Configurations

Figure 1:
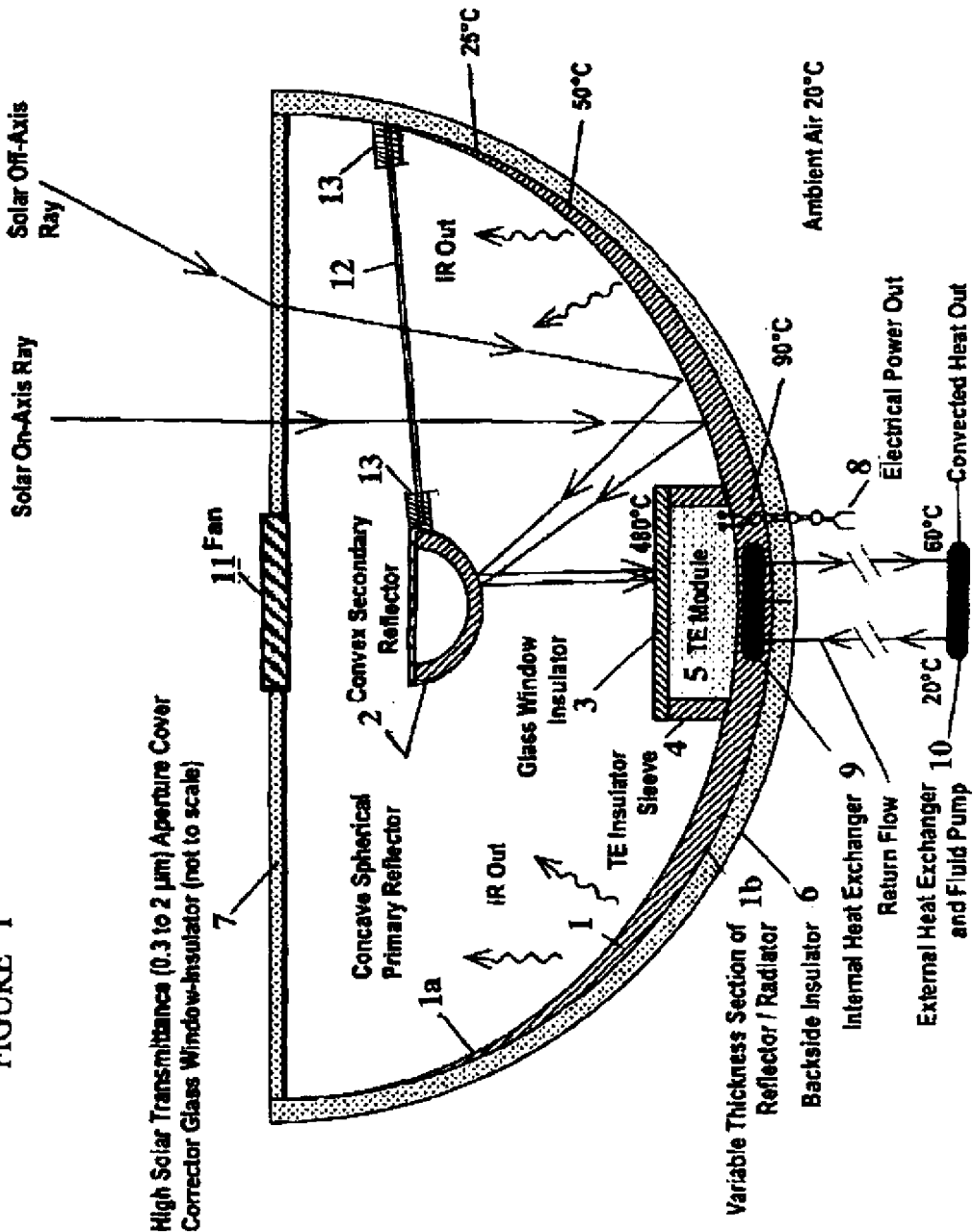
FIG. 1 is a schematic representation of one terrestrial embodiment of the invention in which the reflector/radiator has a spherical front surface reflector and for which a thermal insulation requirement may exist between the reflector/radiator and the ambient environment.

The basic design configuration is shown in one embodiment in FIG. 1 and comprises a dual function concave spherical primary reflector 1a/radiator 1b integrated as a single component 1, a convex secondary reflector component 2, and two TE module insulating elements—a glass window insulator 3 and a TE insulator sleeve 4—which are used in conjunction with a TE module 5 consisting of TE semiconductor devices comprising n and p couples. The TE module has a highly absorptive coating in the solar spectrum on its exposed external hot side surface at the window insulator interface for the purpose of converting the concentrated solar energy flux projected onto that surface into an input heat flow Qin. This arrangement effectively creates a high temperature on the hotter side of the TE module, and a large temperature difference $\Delta T$ across the module results from heat removal at the TE module cold side. A fraction $\eta te$ of the resulting input heat flow produces DC electricity, symbolized by the twisted wire pair 8. A backside insulator 6 and an aperture cover/corrector glass window-insulator 7 may or may not be included in the configuration, depending on the specific application of the invention (for example, whether terrestrial or space-borne, and whether with or without solar tracking). The TE module 5 may or may not be fabricated using high performance bulk alloy devices such as doped lead telluride (PbTe) or similar alloy materials capable of efficient heat-to-electricity conversion at elevated temperatures where the device figure-of-merit <ZT> is a maximum.

FIG. 1 is not drawn to scale and the relative vertical location of the convex secondary reflector may vary as required in accordance with its geometrical shape or optical figure. FIG. 1 is drawn to clearly indicate the key components of the invention in a terrestrial application. For clarity in this discussion, it is convenient to use a practical value of Thot=Tcrit (as defined above) equal to 500 deg C. (773 K), a realistic value for doped PbTe. In the embodiment of the invention shown in FIG. 1, the highly reflective spherical front surface 1a of the reflector/radiator component 1 (e.g., highly polished aluminum, aluminum alloy, or other reflective optical coating) focuses impinging solar rays by specular reflection onto a highly reflective convex secondary reflector 2 that in turn directs the concentrated solar light onto the hot (upper) surface of the TE module 5. The front surface coating 1a of the reflector/radiator may have a high IR emissivity value (for example, similar to silverized teflon) that allows it to also function as an efficient IR radiator surface for the terrestrial application if the reflector/radiator temperature becomes too warm. The IR emissivity property may be temperature dependent. The TE insulating window 3 has a high thermal resistance against conduction losses to the ambient air or gas and a high transmission coefficient in the solar light spectrum; it has a low transmission coefficient at IR wavelengths corresponding to temperatures T<500 deg C. (i.e., Thot<Tcrit in the case of doped PbTe) and corresponding to a maximum blackbody IR wavelength $\lambda$max=3.7 microns, thereby ensuring maximum heat capture and maximum input heat Qin. The TE insulating window material may be, but is not limited to, borosilicate (pyrex) glass, having a 91% transmission coefficient in the wavelength range of about $0.38<\lambda<1.8$ microns, but essentially opaque to IR for about $\lambda>2.8$ microns, when its thickness is about 8 mm. Borosilicate glass can withstand the thermal shock and high temperature (for example, 500 deg C.) that may be generated on the TE hot side surface.

The TE module 5, in part comprising an array of p-n couples or devices aligned in accordance with the preferred temperature gradient for electricity production and which may be configured into a disk-shaped arrangement or distribution, is designed to have a geometrical aspect ratio and size that together provide the correct thermal resistance for establishing a maximum value of $\Delta T$ (for example, 410 deg C. in FIG. 1) produced by the maximum conducted heat flow Qcond, which is in turn determined by the highest expected terrestrial solar energy flux (about 1000 W/m^2 at the C-STEPS aperture), the TE device conversion efficiency $\eta te$, and the electrical power output requirement Wte of the TE module. Here Wte=$\eta te$*Qin and Qcond=(1−$\eta te$)*Qin=Wte*(1−$\eta te$)/$\eta te$. In addition to the TE device array, the TE module comprises a solar absorptive (upper) surface at the hot end that is thermally integrated with the device array, and a heat rejection (lower) surface that is thermally integrated with the device array at the cold end. These surfaces are thermally isolated from each other except via the intrinsic thermal resistance of the TE device array. The TE insulator sleeve 4 prevents conduction and convection heat leaks into the air or gas within the envelope volume formed by the reflector front surface 1a and the aperture cover/corrector glass window-insulator 7, applicable in a non-vacuum environment (for example, the terrestrial application of FIG. 1). In the case of a vacuum environment (for example, in a space application), the sleeve design ensures low IR radiation heat loss from the device array and may be formed from reflective multi-layer insulation (MLI) or similar low emissivity material. The invention Numerical Design Model shows that a higher TE module electrical conversion efficiency $\eta te$ results in a smaller TE module 5, a smaller aperture cover/corrector glass window-insulator 7 diameter, a smaller reflector/radiator 1, and lower materials cost for the C-STEPS configuration.

The thermally conductive integrated reflector/radiator 1, i.e., 1a and 1b, has variable radiator thickness 1b consistent with an acceptable radial temperature drop that necessarily results from that fraction of the conducted heat Qcond flowing out of the TE module cold side surface into the reflector/radiator, and which is radiated as Qrad diffusely and/or specularly from the front surface 1a of the reflector/radiator, in the invention embodiment shown in FIG. 1. The radiator temperatures shown by example in FIG. 1 vary from 90 deg C. near center to 25 deg C. near edge, consistent with the radial heat flow. The optimum temperature variation is determined by the invention Numerical Design Model to minimize the reflector/radiator mass by optimizing the variation of the reflector/radiator thickness profile. The backside of the reflector/radiator is insulated from the ambient environment by the backside insulator 6 to prevent unwanted heat loss to the near-surround. For example, a significant fraction of the conducted heat flow Qcond may be redirected as Qconv to provide passive heating for other terrestrial uses, and this feature may also function as a primary temperature regulating mechanism to maximize the TE electrical conversion efficiency ηte and maintain the TE hot side surface temperature Thot at a safe level (i.e., Thot<Tcrit). Specifically, the redirected heat flow Qconv may function as a source of passive solar heat to augment HVAC or hot water terrestrial heating requirements. As shown in FIG. 1 this function may take the form of a forced convection mechanism comprising an internal heat exchanger 9, embedded in and thermally integrated with the reflector/radiator 1, and an external heat exchanger/pumping mechanism 10 using a suitable working fluid to transport heat where needed at an elevated temperature (for example, 90 deg C. to 60 deg C.) with respect to the ambient air. Variation of the fluid mass flow rate may be used to further control the TE module temperature and maximize the electrical efficiency ηte. The mass flow rate may be automatically controlled using a temperature sensing feedback circuit (not shown). Alternatively, this subsystem may take the form of a thermally conductive link or heat pipe, for example, in a space application. A thermostatically operated fan 11 located at the center of the aperture cover/corrector glass window-insulator 7 further protects the TE module from an unsafe temperature (Thot>Tcrit).

The aperture cover/corrector glass window-insulator 7 is a multifunction component: a) it efficiently transmits both solar incoming and IR outgoing radiation to ensure effective reflector/radiator performance; b) as the reflector/radiator aperture cover, it serves to prevent unwanted and variable convection losses from the front surface of the reflector/radiator to moving ambient air or gas if such heat might otherwise be redirected for a passive heating application; c) it prevents contamination of the reflector/radiator reflective front surface; d) by appropriate location and variable thickness of the glass, it may function as an optical corrector plate to effectively reduce both spherical aberration and astigmatism in the optical system and to direct non-paraxial rays, as shown in FIG. 1, onto the TE hot side (upper) surface over a wide range of sun elevation and ascension angles in the absence of solar tracking. Alternatively, these functions may be realized by a radially graduated-refractive-index (GRIN) window of uniform thickness. The GRIN radial refraction index may be designed to duplicate the optical effect of the variable thickness of a Schmidt camera corrector plate. It may have a lower mass than the equivalent corrector plate for a space application. It may also be fabricated from a Gradium© glass.

To optimize the design of the Concentrated Solar TE Power System invention for a particular application, it is desirable to incorporate one or more mechanisms to prevent overheating of the TE module hot side (upper) surface when the TE module geometry and thermal resistance are fixed for a given application, for example, when the solar flux is maximum, and when Qin and the conducted heat flow Qcond also attain their maximum possible values. Such mechanisms ensure a safe operating temperature (Thot<Tcrit) by effectively controlling the temperature of the TE module cold side by regulating the amount of radiated Qrad and/or convected heat flow Qconv out of the reflector/radiator 1. Therefore, Tcold attains its lowest practical value while Thot floats above Tcold by a maximum ΔT for which Thot<Tcrit. Convection or conduction mechanisms for this purpose have been described above in reference to FIG. 1. Other mechanisms that may be incorporated in the C-STEPS design to perform this function include but are not limited to a) the amount of IR radiation emitted from the reflector/radiator surface(s), for example by means of a variable effective radiator area or by a temperature-dependent front surface emissivity coating or treatment 1a; b) a phase change material having suitable capacity to handle variations in the conducted heat Qcond and embedded in or thermally integrated with the reflector/radiator 1, for example, at the position of the internal heat exchanger 9, for the purpose of regulating its temperature; c) a multi-stage TE module rather than the single stage 5 version shown in FIG. 1, whereby said configuration may have a segmented or cascaded geometry to take advantage of TE devices having different optimum operating temperature ranges to increase the effective electrical efficiency ηte; d) a thermostatically operated fan 11 located at the center of the aperture cover to compensate for any failure in the main convection loop 9-10 and thereby protect the TE module from an unsafe temperature.

For the purpose of mechanically supporting and facilitating the critical alignment of the secondary convex reflector, three or more supports 12 (e.g., threaded rods or rigid vanes with threaded rod ends) are used in conjunction with locking pivotal connectors 13 at either end of the several supports. In FIG. 1 these components are shown between the secondary reflector 2 and the reflector/radiator 1, although an alternative arrangement could utilize the fan housing 11 or aperture cover/corrector glass window-insulator 7 if sufficient optical stability is obtainable. These components have thin profiles in order to minimize the reduction of the incident solar flux into the primary reflector/radiator front surface.

Figure 2:
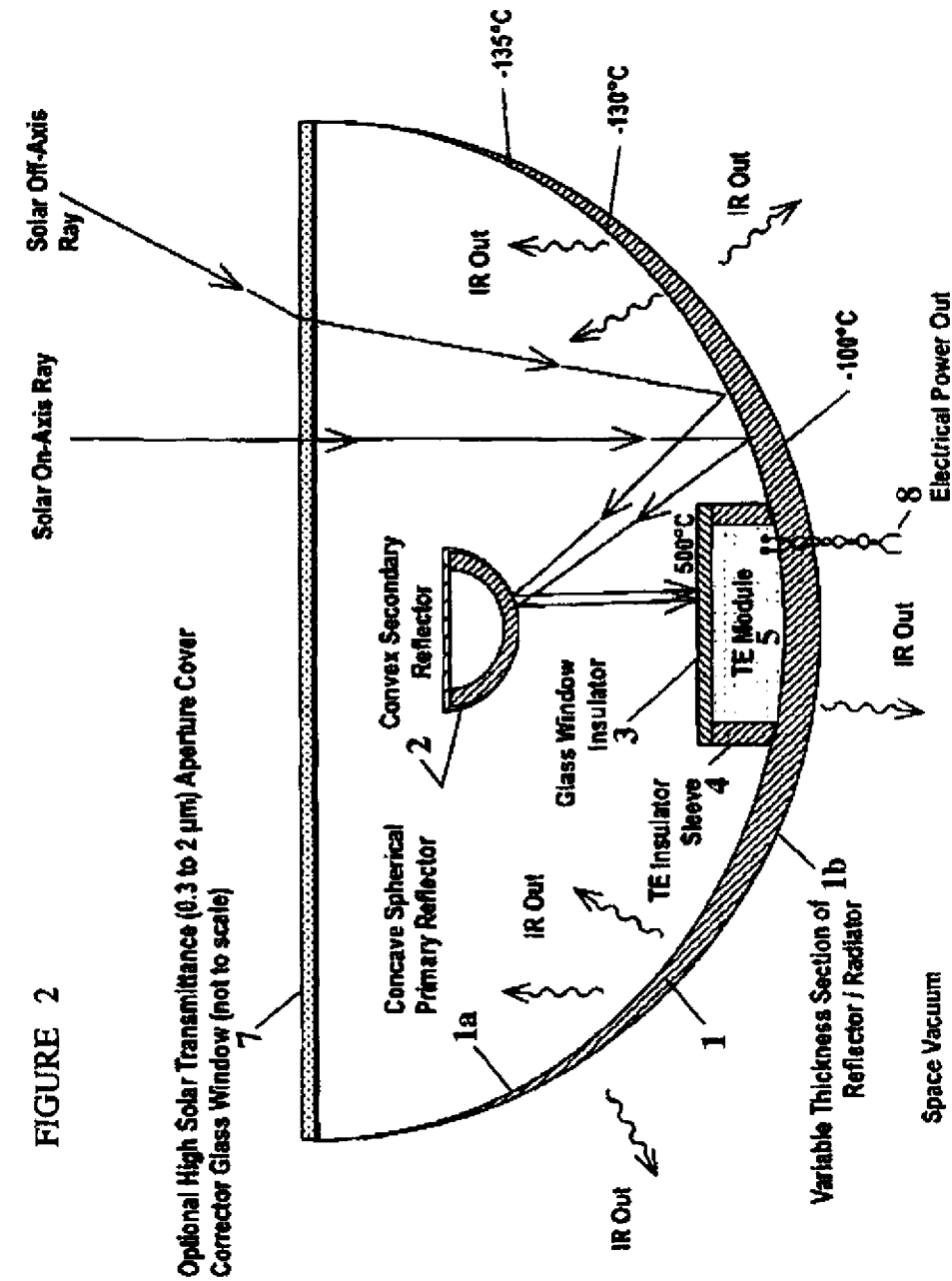
FIG. 2 is a schematic representation of a second embodiment of the invention in which the reflector/radiator has a spherical front surface reflector and for which no significant thermal insulation requirement exists between the reflector/ radiator and the surrounding environment, such that the backside of the reflector/radiator is available for the IR radiation function, as in a space vacuum environment.

FIG. 2 (not to scale) shows the invention design without the backside insulator 6, heat exchangers 9 and 10, and fan 11 of FIG. 1. This configuration of C-STEPS is used in a vacuum environment (for example a space, high altitude, or other low ambient pressure application) to establish a larger ΔT, for a given Tcrit, than is possible in a terrestrial application. This is because Tcold (in space) can be less than Tcold (in ambient air), as designated by the −100 deg C. temperature in FIG. 2 vs. the +90 deg C. temperature in FIG. 1 near the reflector/radiator center. It is unlikely that a significant fraction of the conducted heat Qcond at the highest solar flux (~1365 W/m^2 in low earth orbit) would be redirected as Qconv for satellite or spacecraft heating requirements, but in that case components 9 and 10 or their equivalent (heat pipe or thermal link) would be present. Without the convection loop a larger effective radiator area must accommodate the larger IR heat rejection Qrad to attain the lowest possible reflector/radiator 1 central temperature, i.e., Tcold. A large value of μte is therefore possible without significantly increasing the terrestrial C-STEPS mass, because the invention design in FIG. 2 can use both the front and backsides of the reflector/radiator 1 to maximize Qrad. In FIG. 2 the backside surface IR emissivity and the surface rugosity can be maximized for IR radiation without regard to the front surface specular reflection function. In this case the aperture cover/corrector glass window-insulator 7 may be eliminated if solar tracking is implemented, because the insulating feature is not required in vacuum. In this case the solar flux concentration on the TE module 5 may be slightly degraded due to spherical aberration and astigmatism.

FIG. 3 (not to scale) shows another embodiment of the invention that is also applicable to a vacuum environment. Here the reflector/radiator 1 has a parabolic front surface 1a to direct paraxial solar flux onto the TE module hot side (upper) surface. The parabolic design requires no spherical aberration correction plate, but it is subject to astigmatism and therefore is most appropriate for an application that includes solar tracking. It has the same options and advantages of the FIG. 2 invention design in terms of its two-sided radiator function. This and other embodiments of the invention may be integrated with a space or terrestrial photovoltaic solar panel system to augment its electrical output.

A practical configuration of the terrestrial design of the invention for a high power application might comprise a close-packed array of many moderately sized low power (for example <100 watts) C-STEPS units operating in a series/parallel electrical configuration to provide a desirable electrical voltage and current. Such an array would have a void area for direct solar flux of about 9.3%. The void area could be reduced by the inclusion of smaller C-STEPS units in the array interstices.

Another invention configuration comprises an array of concave troughs, whereby FIG. 1, FIG. 2, and FIG. 3 represent the end-on cross-sectional views of the individual C-STEPS segments in a given trough. In this case the TE module 5, comprising an array of p-n couples, may be configured as a linear series of rectangular-shaped (rather than disk-shaped) modules distributed along the length of the troughs. The refractive function of the aperture cover/corrector glass window-insulator 7 in FIG. 1 and FIG. 2. (i.e., the variable thickness or GRIN disk-shaped aperture cover) is modified from a cylindrically symmetric disk to a linear plate symmetric with respect to the central vertical plane of the trough.

The concentrated solar trough application of C-STEPS is fundamentally different from current conventional concentrated solar trough arrangements that only function as a linear heat exchanger to heat a working fluid flowing through a pipe located at the optical focus. Here each trough provides uniform heat to its array of TE modules that in turn directly generate equal electricity in each segment at a given solar flux. Removal of excess heat from the TE module cold side of each trough segment is effected by parallel flows so that the ΔTs of all segments are substantially equal.

Theoretical TE Device Efficiency

FIG. 4 shows the expected maximum TE device efficiency as a function of the average figure-of-merit <ZT> for two values of Z: Z=0.002/K and Z=0.004/K. For an application, such as a space application, where the lowest TE cold side temperatures may be obtainable, and in which the TE hot side temperature is about 773 K and, by example, the TE cold side temperature is about 155 K, the Carnot efficiency ηcar is about 0.80, and the maximum absolute theoretical efficiency for TE electrical conversion is about 0.19 if Z=0.002/K and about 0.29 if Z=0.004/K. For an application, such as a terrestrial application involving both electrical and thermal energy generation, where the lowest TE cold side temperatures may be substantially above ambient, and in which the TE hot side temperature is about 773 K and, by example, the TE cold side temperature is about 387 K, the Carnot efficiency ηcar is about 0.50, and the maximum absolute theoretical efficiency for TE electrical conversion is about 0.12 if Z=0.002/K and about 0.17 if Z=0.004/K. These examples illustrate the efficiency advantages of high Z TE materials and elevated operational temperatures.

Numerical Design Model

A rigorous mathematical analysis of the heat transfer physics of the thermal and optical aspects of the C-STEPS invention is the basis used to create a Numerical Design Model as a central feature of the invention. The Thermal Design Feature of the model can be used to optimize the C-STEPS thermal design for a required electrical output power from the TE module by allowing variation of all key design parameters that characterize the geometrical, optical and thermal properties of the C-STEPS components comprising the total system. Such parameters include but are not limited to solar and albedo flux intensities, solar absorptivities, IR emissivities, solar transmission coefficients, component view factors, thermal conductivities of the TE module and reflector/radiator materials, TE module geometry, and the effective "sky" temperature. The optimization problem is very nonlinear because radiation, conduction, and TE device efficiencies depend differently on temperatures and temperature differences—however, closed form analytical solutions are possible using analytic quartic equations and iterative computing techniques, making the model amenable to a spreadsheet format.

The design optimization logic varies with the C-STEPS application, for example, whether the system is to be operated in a terrestrial or space environment, and in accordance with the chosen constraints, i.e., input parameters, and the output requirements, e.g., the electrical output power, the total system mass, or the reflector/radiator aperture, in conjunction with other given parameters.

The required aperture area is directly proportional to the required electrical output power, and inversely proportional to the TE device efficiency, TE hot side solar absorptivity, and solar flux. Given a safe maximum value of Thot, the TE cold side temperature is determined in the manner described below, which depends on the radiator geometry and the net heat radiated. Results are parameterized by the reflector/radiator 1 effective radiator 1b surface area-to-aperture cross-sectional area ratio. An iterative method determines the exact module efficiency using the result for Tcold and experimental data curves for 2% Tl—PbTe, by example. The minimum TE module surface area is determined to give the required heat flow to maximize the electrical power. The model component masses are determined as a function of the ratio, enabling an estimate of component costs.

Neglecting the minimal IR radiation loss from the relatively small area of the TE module's hot side surface, insulated by the TE borosilicate glass window 3, the reduced equation for the TE cold side temperature Tcold can be determined from $$Q_{rad} = F_{rad\text{-}IR} * \sigma * \epsilon_{rad} * \int \{T(r)^4 - T_{sky}^4\} * dA \qquad (1)$$

In Equation (1) Qrad is the net heat (i.e., conducted heat from the TE cold side plus a fraction of the incident solar and albedo radiation absorbed minus any heat convected out of the reflector/radiator heat exchanger 9 via a working fluid) to be radiated out from the reflector/radiator 1—in a first iteration it is determined using an estimated TE device efficiency and the required electrical output power; σ is the Stephan Boltzmann constant, Frad-IR is a function of the system optical properties/view factors, Tsky is the effective sky or space temperature as viewed by the radiator, and $T(r) = T_{cold} - c*r$, where c is the reflector/radiator radial thermal gradient. The integration is carried out over the effective radiator radius from the TE module radius to the effective radiator edge, and the resulting analytical quartic equation is then solved for Tcold. Varying the gradient c results in different radiator thickness profiles and reflector/radiator masses. Since the TE hot side is constrained at its maximum allowable value, $\Delta T$ is determined and a new value of thickness is computed. This is an iterated method that rapidly converges. Given a known electrical output power Wte requirement and the device efficiency at the final iterated value of $\Delta T$, the value of the thermal resistance Rt and the TE module geometry are computed consistent with Thot=Tcold+Rt*Qcond. The advantage of bulk alloys is that they are machinable for compliance with the model design and can take advantage of the increased TE efficiency at the higher temperature region. Solutions are computed for a range of reflector/radiator 1 effective radiator 1b surface area-to-aperture cross-sectional area ratios that determine the best operating point that satisfies the solution constraints.

For the terrestrial application shown in FIG. 1, the model calculates the required aperture cross-sectional area and TE module thermal resistance for the case of a given maximum input heat Qin, i.e., maximum solar flux (for example, 1000 W/m^2), the given desired TE module temperatures (for example, Thot=500 deg C. and Tcold=90 deg C.), and the desired electrical output power Wte (for example, 100 W) using the temperature-dependent TE device electrical conversion efficiency $\eta$te. An iterative method determines the exact module efficiency (for example, using experimental data curves for doped PbTe bulk alloys or similar TE materials), minimizes the TE module volume and optimizes its geometry to give the required heat flow, and maximizes the electrical power. The mass flow rate of the working fluid in the convection loop is calculated using the computed values of the conducted heat Qcond and the net radiated heat Qrad, which depends on the effective radiation surface area of the reflector/radiator, radial temperature gradient, and optical properties of the radiation surface area. For lesser values of Qin (lower solar flux levels), lower mass flow rates are calculated to maintain Tcold at the desired value for useful solar passive heating and to maximize $\eta$te and Wte at the lower values of Thot. Results are further parameterized by the reflector/radiator 1 effective radiator 1b surface area-to-aperture cross-sectional area ratio. The Numerical Design Model computes the component masses and total mass of the C-STEPS terrestrial design to identify the optimum tradeoff between electrical efficiency, system mass, and system cost.

One example of a solution set for the TE module temperatures and temperature differences for a terrestrial application of the invention using the Thermal Design Feature is given in FIG. 5, taken from a Numerical Design Model Excel© spreadsheet chart, similar to that shown in Addendum 2, attached herein. In FIG. 5 the absolute efficiency is 0.127 (12.7%) for Z=0.002/K when 150 W of heat is convected (Qconv) from the heat exchanger at about 72 deg C, the TE cold side temperature, warm enough for hot water heating. The TE module $\Delta T$ is about 420 K for an area ratio=1.2, giving a Carnot efficiency $\eta$car of about 0.54 (54%). About 20% of the conducted heat Qcond=190 W is radiated (Qrad) from the front surface of the reflector/radiator.

For the space application shown in FIG. 2 and FIG. 3, removal of a substantial quantity of heat Qconv by convection is generally not an option for achieving a low value of Tcold. However, both frontside and backside surfaces of the reflector/radiator 1 can be used to minimize Tcold by maximizing the radiated IR heat Qrad. For a given TE module hot side temperature (for example, Thot=500 deg C.) and a given maximum Qin, i.e., maximum solar flux (for example, 1365 W/m^2 in low earth orbit), and an estimated value of the electrical conversion efficiency $\eta$te, the model calculates the lowest TE module cold side temperature (for example, Tcold=−100 deg C., as shown in FIG. 2 and FIG. 3) that is attainable with Qconv=0. It then computes a new TE device electrical conversion efficiency $\eta$te, the required aperture cross-sectional area to obtain the desired electrical output power Wte, and the TE module thermal resistance for the case of maximum input heat Qin. An iterative method determines the exact value of Tcold and the module efficiency $\eta$te, minimizes the TE module volume and optimizes its geometry to give maximum heat flow and electrical power. For lesser values of Qin (lower solar flux levels) and a fixed effective radiation area, Tcold, $\Delta T$, and Thot values all become lower as a result of the decreased value of Qcond. Therefore, $\eta$te and Wte also become lower. As for the terrestrial design application, the results are further parameterized by the ratio of radiator surface area to aperture cross-sectional area. The Numerical Design Model computes the component masses and total mass of the C-STEPS space design to identify the optimum tradeoff between electrical efficiency, system mass, and system cost.

One configuration for the preferred optical embodiment using the Optical Design Feature is given in FIG. 6, taken from the Numerical Design Model Excel© spreadsheet chart, Addendum 1 attached herein. It will be recognized in FIG. 6 that the paraxial solar flux is uniformly and symmetrically collimated onto the TE hot side surface when the front surface of the concave primary reflector/radiator 1a and the front surface of the convex secondary reflector 2 are both parabolic and are situated on the optical axis such that their real and virtual foci, respectively, are coincident. It is further observed in this example that the diameter of the secondary is sized to be the same as the TE module diameter, optimizing the concentration of the incident solar flux impinging on the TE module.

The following references are hereby incorporated by reference herein as supportive background information regarding the invention:

*Applications of Thermoelectricity*, H. J. Goldsmid, John Wiley and Sons Inc., New York, 1960.

*Thermoelectricity: an Introduction to the Principles*, D. K. C. MacDonald, John Wiley and Sons Inc., New York, 1962.

*Thermoelectric Refrigeration*, H. J. Goldsmid, Plenum Press, New York, 1964.

*Fundamentals of Optics*, $3^{rd}$ ed., F. A. Jenkins and H. E. White, McGraw-Hill, New York, 1957, Chapters 6, 9, and 10.

*Heat Transfer*, 4th ed., J. P. Holman, McGraw-Hill, New York, 1976, Chapter 8.

*Heat and Thermodynamics*, 6th ed., M. W. Zemansky and R. H. Dittman, McGraw-Hill, New York, 1981.

"Enhancement of Thermoelectric Efficiency in PbTe by Distortion of the Electronic Density of States", J. P. Heremans et al., *Science* 321, p. 554 (July 2008)

Joseph Heremans, http://researchnews.osu.edu/archive/thermal

"Accelerating the Commercialization of Promising New Thermoelectric Materials", L. Bell, Proc. Of the Materials Science & Technology 2008 Conference and Exhibition, Pittsburgh, Pa. October 2008.

D R Ladner and J. P. Martin, "Thermal Model for a Mars Instrument with Thermo-Electric Cooled Focal Plane", presented at the Cryogenic Engineering Conference, Keystone, Colo., August 2005, *Advances in Cryogenic Engineering* 51B, American Inst. Of Physics, Melville, N.Y., p. 1548 (2006).

Paul Magill, Nextreme Thermal Solutions, Research Triangle Park, N.C., (personal communications and meetings in 2008 and 2009).

Dave Koester, Nextreme Thermal Solutions, Research Triangle Park, N.C., (personal communications and meetings in June 2010).

Dimitri Kossakovski, PhD, ZT Plus, Azusa, Calif. (personal communication, April 2010)

Nobert Elsner, Hi-Z Technology, Inc., San Diego, Calif. (personal communication, 2008).

"A Grand Plan for Solar Energy", K. Zweibel et al., Scientific American, p. 64 (January 2008).

*Thermionic and Thermoelectric Refrigeration and Power Generation Using Semiconductor Nanostructures*, M. F. O'Dwyer et al., Phys. Rev. B, 2006.

*Approaches to Thermal Isolation with Thin-Film Superlattice Materials*, P. Addepalli. A. J. Reddy, and R. Venkatasubramanian, Mat. Res. Soc. Symp., vol 793, Materials Research Society, 2004, S11.1.1

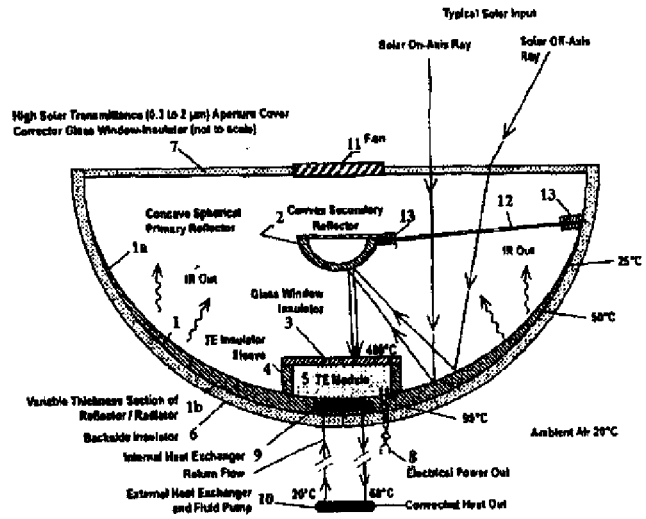

What is claimed is:

1. An axially symmetric thermo-optical system comprising:
    a primary reflector/radiator component having a concave front surface and a convex back surface, wherein the concave front surface reflects incident solar flux, wherein the concave front and the convex back surfaces reject thermal energy via infrared (IR) radiation, wherein a thermally conductive homogeneous solid material comprising said primary reflector/radiator has a monotonic decreasing thickness h(r) that is maximum at its center and minimum at its edge, and further wherein said thickness varies with the radial distance r from the center of the reflector/radiator in proportion to equal flows comprising radial heat conduction Qcond=2*π*r*h(r)*k*c and infrared (IR) radiation Qrad at said radial distance, as:
    $h(r)=Qrad/(2*\pi*r*k*c)$, where, within said reflector/radiator,
    c=dT/dr is the radial temperature gradient,
    k is the thermal conductivity,
    and $Qrad=Frad\text{-}IR*\sigma*\epsilon rad*\int\{T(r)^4-Tsky^4\}*dA$ is the heat radiated from the area between r and the outer radius Ro,
    where $dA=2\pi r\,dr$,
    and where Frad-IR is a reflector/radiator view factor, σ=Stephan Boltzmann constant, ε rad is the IR emissivity, Tsky is the effective sky or space temperature, and T(r)=Tcold−c*r is the radial temperature profile,
    and further wherein Tcold, the TE module cold side temperature, is a unique function of c, determined to minimize the reflector/radiator mass for a maximum required electrical output power Wte, requiring a TE module maximum heat input Qin and maximum conducted heat Qcond, both being proportional to the maximum solar flux at the reflector/radiator aperture;
    a secondary convex reflector component positioned on-axis and above the concave front surface of the primary reflector/radiator component, wherein the secondary convex reflector component is smaller than the primary reflector/radiator component;
    a support and alignment structure for the secondary convex reflector component for attachment to the primary reflector/radiator component;
    and a thermoelectric (TE) module converter comprising a TE module cold side and a TE module hot side, wherein the TE module cold side is thermally integrated with the center of the concave front surface of the primary reflector/radiator component.

2. The system of claim 1, wherein said support and alignment structure comprises a set of adjustable struts, rods, vanes, or a combination thereof, to facilitate optical alignment and positioning of the secondary convex reflector component with respect to the primary reflector/radiator component using at least one locking pivotal connector at an end of the strut, rod or vane.

3. The system of claim 2, wherein an optically transparent/infrared (IR) opaque glass window is attached to an external surface of the TE module hot side and a multi-layer insulation (MLI) insulator sleeve is attached to an external lateral surface of the TE module.

4. The system of claim 3, wherein the primary reflector/radiator component is fabricated from a low density, high thermal conductivity material incorporating a phase change material at the center of its external convex surface.

5. The system of claim 4, wherein the primary reflector/radiator component has a maximum thickness at its center and a minimum thickness at its perimeter and wherein the thickness is determined by minimum reflector/radiator mass, maximum IR radiation output and maximum TE module electrical conversion efficiency.

6. The system of claim 5, wherein a total system mass is determined to maximize electrical power out of the system.

7. The system of claim 6, wherein the concave front and the convex back surfaces of the primary reflector/radiator component are coated with high IR emissivity coatings, wherein the concave front surface coating is also a solar reflective coating.

8. The system of claim 7, wherein the secondary convex reflector component front surface is coated with a high reflective coating in the solar spectrum.

9. The system of claim 8, wherein a thermal interface in the primary reflector/radiator component conducts a portion of the rejected heat from the TE module cold side to an external IR radiator.

10. The system of claim 9, wherein multiple units of the thermo-optical system are electrically configured in external series-parallel arrangements to produce nominal values of electrical voltage, power, and current.

11. The system of claim 10, wherein the TE module comprises TE materials capable of operational temperatures of at least 773 K at the hot end of the TE module and at least 100 K at the cold end of the TE module.

12. The system of claim 11, wherein reflecting surfaces of the primary reflector/radiator component and the secondary convex reflector component are parabolic, symmetrically positioned along the principal optical axis, and have coincident foci.

13. The system of claim 11, wherein the reflecting surfaces of the primary reflector/radiator component and the secondary convex reflector component are non-parabolic.

14. The system of claim 13, wherein an aperture cover/corrector glass window-insulator is attached at the aperture of the primary reflector/radiator component, and wherein said aperture cover/corrector glass window-insulator:
    a) is of variable thickness;
    b) has a high transmittance in visible and near infrared (IR) wavelength ranges; and
    c) has a radially graduated refractive index.

15. A thermo-optical system, integrated with the backside of an extant photovoltaic solar panel that emanates infrared (IR) radiation from said backside, comprising:
    (a) a reflector/radiator component, having a front surface and a convex back surface, wherein said front surface reflects infrared (IR) radiation from said photovoltaic panel, and wherein said back surface rejects thermal energy via infrared (IR) radiation, wherein a thermally conductive homogeneous solid material comprising said primary reflector/radiator has a monotonic decreasing thickness h(r) that is maximum at its center and minimum at its edge, and further wherein said thickness varies with the radial distance r from the center of the reflector/radiator in proportion to equal flows comprising radial heat conduction Qcond=2*π*r*h(r)*k*c and infrared (IR) radiation Qrad at said radial distance, as:

h(r)=Qrad/(2*π*r*k*c), where within said reflector/radiator c=dT/dr is the radial thermal gradient, k is the thermal conductivity, and Qrad=Frad-IR*σ*ε rad*∫{T(r)^4−Tsky^4}*dA is the heat radiated from the area between r and the outer radius Ro, where dA=2 π r dr, and where Frad-IR is a reflector/radiator view factor, σ=Stephan Boltzmann constant, ε rad is the IR emissivity, Tsky is the effective sky or space temperature, and T(r)=Tcold−c*r is the radial temperature profile, and further wherein Tcold, the TE module cold side temperature, is a unique function of c, determined to minimize the reflector/radiator mass for a maximum required electrical output power Wte, requiring a TE module maximum heat input Qin and maximum conducted heat Qcond, both being proportional to the maximum absolute temperature of the backside of said photovoltaic solar panel;

(b) a photovoltaic solar panel that emanates said infrared (IR) radiation;

(c) a thermally insulating support structure for fastening the reflector/radiator component to the photovoltaic solar panel, wherein the reflector/radiator component reflects said infrared (IR) radiation emanating from said photovoltaic solar panel; and (d) at least one thermoelectric (TE) module converter comprising a TE module cold side and a TE module hot side, wherein the TE module hot side is thermally integrated with the backside of the solar panel and the TE module cold side is thermally integrated with the front surface of the reflector/radiator component.

16. The system of claim 15, wherein an insulator sleeve is attached to an external lateral surface of the TE module.

17. The system of claim 16, wherein the primary reflector/radiator component is fabricated from a low density, high thermal conductivity material incorporating a phase change material at the center of its external convex surface.

18. The system of claim 17, wherein the reflector/radiator component has a maximum thickness at its center and a minimum thickness at its at its perimeter and wherein the thickness is determined by minimum reflector/radiator mass, maximum IR radiation output and maximum TE module electrical conversion efficiency.

19. The system of claim 18, wherein a front surface of the reflector/radiator component is coated with a high IR reflectivity coating and a back surface of the reflector/radiator component is coated with a high IR emissivity coating.

20. The system of claim 19, wherein multiple units of the thermo-optical system are electrically configured in external series-parallel arrangements to produce nominal values of electrical voltage, power, and current.

* * * * *

UNITED STATES PATENT AND TRADEMARK OFFICE
CERTIFICATE OF CORRECTION

PATENT NO. : 8,975,505 B2  
APPLICATION NO. : 12/924484  
DATED : March 10, 2015  
INVENTOR(S) : Daniel Ray Ladner Page 1 of 7

It is certified that error appears in the above-identified patent and that said Letters Patent is hereby corrected as shown below:

Delete the title page and substitute the attached title page therefor.

In the Drawings

Delete drawing sheets 1-5 and substitute the attached drawing sheets 1-5 therefor.

Signed and Sealed this  
Fifth Day of May, 2015

Michelle K. Lee  
*Director of the United States Patent and Trademark Office*

(12) United States Patent
Ladner

(10) Patent No.: US 8,975,505 B2
(45) Date of Patent: Mar. 10, 2015

(54) CONCENTRATED SOLAR THERMOELECTRIC POWER SYSTEM AND NUMERICAL DESIGN MODEL

(76) Inventor: Daniel Ray Ladner, Boulder, CO (US)

(*) Notice: Subject to any disclaimer, the term of this patent is extended or adjusted under 35 U.S.C. 154(b) by 298 days.

(21) Appl. No.: 12/924,484

(22) Filed: Sep. 28, 2010

(65) Prior Publication Data
US 2011/0073149 A1 Mar. 31, 2011

Related U.S. Application Data

(60) Provisional application No. 61/277,662, filed on Sep. 28, 2009.

(51) Int. Cl.
| | |
|---|---|
| H01L 35/00 | (2006.01) |
| H01L 35/30 | (2006.01) |
| F24J 2/13 | (2006.01) |
| F24J 2/14 | (2006.01) |
| F24J 2/18 | (2006.01) |
| F24J 2/46 | (2006.01) |
| F24J 2/50 | (2006.01) |

(52) U.S. Cl.
CPC . *H01L 35/30* (2013.01); *F24J 2/13* (2013.01); *F24J 2/14* (2013.01); *F24J 2/18* (2013.01); *F24J 2/4621* (2013.01); *F24J 2/4625* (2013.01); *F24J 2/50* (2013.01); *F24J 2200/04* (2013.01); *Y02E 10/45* (2013.01)
USPC .................................. 136/214; 136/206

(58) Field of Classification Search
CPC ........ H01L 35/28; H01L 35/325; H01L 35/00
USPC ................................................ 136/214, 206
See application file for complete search history.

(56) References Cited

U.S. PATENT DOCUMENTS

| | | | | |
|---|---|---|---|---|
| 4,002,499 A | * | 1/1977 | Winston | 136/206 |
| 4,131,485 A | * | 12/1978 | Meinel et al. | 136/259 |
| 4,284,867 A | * | 8/1981 | Hill et al. | 219/634 |
| 4,518,232 A | * | 5/1985 | Dagenais | 359/853 |
| 4,883,522 A | * | 11/1989 | Hagerty et al. | 65/17.6 |
| 5,154,777 A | * | 10/1992 | Blackmon et al. | 136/245 |
| 5,274,497 A | * | 12/1993 | Casey | 359/364 |

(Continued)

OTHER PUBLICATIONS

Definition of "solid" obtained from dictionary.com 2013.*

*Primary Examiner* — Jeffrey T Barton
*Assistant Examiner* — Uyen Tran

(57) ABSTRACT

The invention, the Concentrated Solar Thermoelectric Power System, herein abbreviated as C-STEPS, is a thermo-optical system configuration for the purpose of achieving a high solar energy-to-electricity conversion efficiency based on thermoelectric (TE) devices that use the Seebeck effect. It does so by implementing a system for concentrated solar energy using a design that combines a dual-function reflector/radiator component with an active or passive heat convection mechanism to ensure that TE module operation is maintained in a safe elevated temperature range with respect to the ambient temperature. Unsafe module temperatures are avoided by automatically adjusting the TE module hot side temperature directly or indirectly by regulating the TE cold side temperature using a variety of passive or active mechanisms, including the reflector/radiator component, phase change material, or convection/conduction mechanisms. A Numerical Design Model is used to optimize the configuration geometry and performance in various terrestrial and space applications and it is a central feature of the invention.

20 Claims, 6 Drawing Sheets